(12) United States Patent
Kitahara et al.

(10) Patent No.: US 8,044,500 B2
(45) Date of Patent: Oct. 25, 2011

(54) POWER MODULE SUBSTRATE, METHOD FOR MANUFACTURING POWER MODULE SUBSTRATE, AND POWER MODULE

(75) Inventors: Takeshi Kitahara, Toyota (JP); Hiroya Ishizuka, Koshigaya (JP); Yoshirou Kuromitsu, Saitama (JP); Tomoyuki Watanabe, Toyota (JP)

(73) Assignees: Mitsubishi Materials Corporation, Tokyo (JP); Toyota Jidosha Kabushiki Kaisha, Toyota-Shi (JP)

( * ) Notice: Subject to any disclaimer, the term of this patent is extended or adjusted under 35 U.S.C. 154(b) by 197 days.

(21) Appl. No.: 12/446,826

(22) PCT Filed: Oct. 26, 2007

(86) PCT No.: PCT/JP2007/070939
§ 371 (c)(1),
(2), (4) Date: Apr. 23, 2009

(87) PCT Pub. No.: WO2008/050868
PCT Pub. Date: May 2, 2008

(65) Prior Publication Data
US 2009/0267215 A1    Oct. 29, 2009

(30) Foreign Application Priority Data
Oct. 27, 2006 (JP) .................. 2006-292006

(51) Int. Cl.
*H01L 23/52* (2006.01)
*H01L 29/76* (2006.01)
*H01L 23/06* (2006.01)
*H01L 23/10* (2006.01)
*H01L 23/15* (2006.01)

(52) U.S. Cl. ........ 257/691; 257/703; 257/401; 257/706; 257/771

(58) Field of Classification Search .................. 257/691, 257/703, 750, 748, 758, 771, 765, 745, 762, 257/766, 772, 779, 207, 287, 341, 401, 500, 257/502, 578, 675, 706, 705, 713, 718, 741, 257/778
See application file for complete search history.

(56) References Cited

U.S. PATENT DOCUMENTS
2005/0214518 A1    9/2005 Nagase et al.
2007/0274047 A1 * 11/2007 Nagase et al. ................ 361/704

FOREIGN PATENT DOCUMENTS
| JP | 09-321189 A | 12/1997 |
| JP | 2003-268478 A | 9/2003 |
| JP | 2007-329160 A | 12/2007 |
| WO | WO-03/090277 A1 | 10/2003 |
| WO | WO-2007/142261 A1 | 12/2007 |

* cited by examiner

Primary Examiner — Chuong A. Luu
(74) Attorney, Agent, or Firm — Leason Ellis LLP

(57) ABSTRACT

Disclosed is a power module having improved joint reliability. Specifically disclosed is a power module including a power module substrate wherein a circuit layer is brazed on the front surface of a ceramic substrate, a metal layer is brazed on the rear surface of the ceramic substrate and a semiconductor chip is soldered to the circuit layer. The metal layer is composed of an Al alloy having an average purity of not less than 98.0 wt. % but not more than 99.9 wt. % as a whole. In this metal layer, the Fe concentration in the side of a surface brazed with the ceramic substrate is set at less than 0.1 wt. %, and the Fe concentration in the side of a surface opposite to the brazed surface is set at not less than 0.1 wt. %.

4 Claims, 2 Drawing Sheets

POWER MODULE SUBSTRATE, METHOD FOR MANUFACTURING POWER MODULE SUBSTRATE, AND POWER MODULE

TECHNICAL FIELD

CROSS-REFERENCE TO PRIOR APPLICATION

This is the U.S. National Phase Application under 35 U.S.C. §371 of International Patent Application No. PCT/JP2007/070939 filed Oct. 26, 2007, which claims the benefit of Japanese Patent Application No. 2006-292006 filed Oct. 27, 2006, both of them are incorporated by reference herein. The International Application was published in Japanese on May 2, 2008 as WO2008/050868 A1 under PCT Article 21(2).

BACKGROUND ART

Such a power module generally includes a power module substrate, in which a circuit layer is brazed on the front surface of a ceramic substrate while a metal layer is brazed on the rear surface of the ceramic substrate, a semiconductor chip soldered to the circuit layer, and a heat sink joined to the metal layer.

In order to improve the joint reliability of power modules, as disclosed in the Domestic re-publication of PCT International Publication for Patent Application No. WO 03/090277, for example, a circuit layer or a metal layer has conventionally been formed of an Al alloy having a purity of not less than 99.98 wt. % or pure Al.

DISCLOSURE OF INVENTION

Problems to be Solved by the Invention

Meanwhile, the need for further improving the joint reliability of power modules has increased in recent years.

The present invention has been made in view of the above circumstances, with an object of providing a power module substrate that can improve the joint reliability of power modules, a method for manufacturing a power module substrate, and a power module.

Means for Solving the Problems

In order to solve such a problem and to achieve the above object, a power module substrate of the present invention is a power module substrate in which a circuit layer is brazed on the front surface of a ceramic substrate while a metal layer is brazed on the rear surface of the ceramic substrate, and a semiconductor chip is soldered to the circuit layer. The metal layer is composed of an Al alloy having an average purity of not less than 98.0 wt. % but not more than 99.9 wt. % as a whole. In the metal layer, the Fe concentration in the side of a surface brazed with the ceramic substrate is set at less than 0.1 wt. %, and the Fe concentration in the side of a surface opposite to the brazed surface is set at not less than 0.1 wt. %.

According to the present invention, since the Fe concentration in the brazed surface side is set at less than 0.1 wt. % in the metal layer, even when stress is generated in the joint interface formed between the ceramic substrate and the metal layer during the heat cycle which is caused by the difference between the respective coefficients of thermal expansion of the ceramic substrate and the metal layer, this stress can be absorbed by the plastic deformation of the brazed surface side of the metal layer. As a result, the stress acting on the joint interface can be suppressed, and thus the joint reliability of the ceramic substrate and the metal layer can be improved.

On the other hand, since the Fe concentration in the side of a surface opposite to the brazed surface is set at not less than 0.1 wt. %, it is possible to gradually harden the side of a surface opposite to the brazed surface as the metal layer thermally deforms repeatedly during the heat cycle, and thus the plastic deformation of this hardened part can be suppressed. As a result, even when cracks are developed in the joint between the surface opposite to the brazed surface of the metal layer and the heat sink during the heat cycle, their further developments can be suppressed, and thus the joint reliability of the power module can be improved.

The metal layer is divided into two regions by a boundary which is determined by using an electron probe microanalyzer (EPMA), and the term "the brazed surface side" refers to one of the two regions where the concentration of Fe contained in the metal layer is reduced, while the term "the opposite surface side" refers to the other region which remains. Alternatively, it is also possible to define "the brazed surface side" as a portion ranging from the brazed surface, towards the opposite surface, down to a position so that the portion includes not less than 10% but not more than 50% of the metal layer in the thickness direction, while the remaining portion being defined as "the opposite surface side".

In this case, the aforementioned effects are reliably achieved.

In addition, the method of the present invention for manufacturing a power module substrate is a method for manufacturing a power module substrate, in which a circuit layer is brazed on the front surface of a ceramic substrate while a metal layer is brazed on the rear surface of the ceramic substrate, and a semiconductor chip is soldered to the circuit layer. In the method, an Al-based brazing filler metal foil and a metal layer member composed of an Al alloy containing Fe of not less than 0.05 wt. % but not more than 1.0 wt. % and having a purity of not less than 98.5 wt. % but not more than 99.95 wt. % are disposed in this order to prepare a laminated body, and thereafter, this laminated body is heated while applying a pressure thereto in the lamination direction, thereby melting the brazing filler metal foil and brazing the metal layer member on the rear surface of the ceramic substrate, as a result of which the power module substrate of the present invention is formed.

In the present invention, since the laminated body is pressed in the lamination direction for brazing, the rear surface of the ceramic substrate and the metal layer member can be brazed satisfactorily, and Fe in the side of a surface brazed with the ceramic substrate in the metal layer member can be dissolved satisfactorily in the brazing filler metal melted in the joint interface. Therefore, a power module substrate can be reliably formed, in which the concentration of Fe contained in the brazed surface side of the metal layer is set at less than 0.1 wt. %, and the concentration of Fe contained in the side of a surface opposite to the brazed surface is set at not less than 0.1 wt. %.

Furthermore, the power module of the present invention is a power module including: a power module substrate, in which a circuit layer is brazed on the front surface of a ceramic substrate while a metal layer is brazed on the rear surface of the ceramic substrate; a semiconductor chip soldered to the surface of the circuit layer; and a heat sink joined to the surface of the metal layer, the above power module substrate being the power module substrate of the present invention.

In this case, a power module with improved joint reliability can be achieved.

Effects of the Invention

According to the present invention, the joint reliability of the power module can be improved.

DESCRIPTION OF THE REFERENCE SYMBOLS

10: Power module; 11: Ceramic substrate; 12: Circuit layer; 13: Metal layer; 13a: Brazed surface; 13b: Opposite surface; 14: Power module substrate; 15: First solder layer; 16: Semiconductor chip; 17: Heat sink; 18: Second solder layer.

BEST MODE FOR CARRYING OUT THE INVENTION

Figure 1:
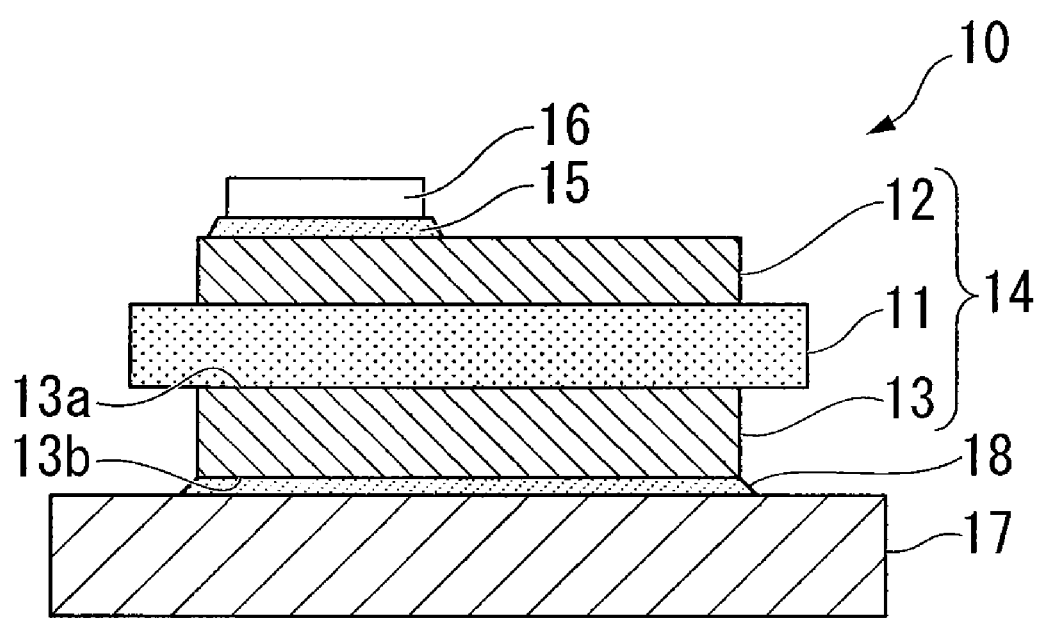
FIG. 1 is an overall view showing a power module to which a power module substrate according to an embodiment of the present invention is applied.

An embodiment of the present invention will be described below with reference to the attached drawings. FIG. 1 is an overall view showing a power module to which a power module substrate according to an embodiment of the present invention is applied.

This power module 10 includes a power module substrate 14, in which a circuit layer 12 is brazed on the front surface of a ceramic substrate 11 while a metal layer 13 is brazed on the rear surface thereof; a semiconductor chip 16 soldered to the surface of the circuit layer 12 via a first solder layer 15; and a heat sink 17 joined to the surface of the metal layer 13 via a second solder layer 18.

Examples of the materials for forming the respective constituent members are as follows. As for the ceramic substrate 11, AlN, $Al_2O_3$, $Si_3N_4$, SiC, or the like may be used. As for the circuit layer 12, pure aluminum or an aluminum alloy may be used. As for the heat sink 17, pure aluminum, an aluminum alloy, pure copper, a copper alloy, or the like may be used. As for the second solder layer 18, a lead-free solder material may be used. In addition, as for the brazing filler metal for brazing the ceramic substrate 11 with the circuit layer 12 and the metal layer 13, an Al-based brazing filler metal such as an Al—Si brazing filler metal may be used. In the present embodiment, an Al—Si brazing filler metal is used, which contains Si of not more than 11.6 wt. % and also at a concentration which is higher than the concentration of Si contained in the metal layer member described layer which forms the metal layer 13.

In the present embodiment, the metal layer 13 is formed of an Al alloy having an average purity of not less than 98.0 wt. % but not more than 99.9 wt. % as a whole, and the concentration of Fe contained in the side of a surface 13a brazed with the ceramic substrate 11 is set at less than 0.1 wt. %, and the concentration of Fe contained in the side of a surface 13b, which is opposite to the brazed surface 13a, is set at not less than 0.1 wt. %. In addition, the brazed surface 13a side is defined as a portion ranging from the brazed surface 13a, towards the opposite surface 13b, down to a position so that the portion includes not less than 10% but not more than 50% of the metal layer in the thickness direction, while the remaining portion being defined as the opposite surface 13b side.

Determination of the brazed surface 13a side and the opposite surface 13b side in the metal layer 13 is carried out as follows. In the cross section obtained by cutting the metal layer 13, by using an electron probe microanalyzer (EPMA), the EPMA line analysis is conducted, from the opposite surface 13b towards the brazed surface 13a, under the conditions of an acceleration voltage of 15 kV, an electric current value of $5 \times 10^{-8}$ A, a spot size of 1 μm, a measuring time per point of 5 seconds, and a movement interval of 1 μm. From the obtained data, a boundary is determined for dividing the metal layer 13 into a region having an Fe concentration of not less than 0.1 wt. % and a region having an Fe concentration of less than 0.1 wt. %.

Then, the brazed surface 13a side and the opposite surface 13b side are each subjected to a measurement using an EPMA with an acceleration voltage of 15 kV, an electric current value of $5 \times 10^{-8}$ A, and a spot size of 30 μm, and the measurement is conducted at 10 points which are randomly chosen in the aforementioned cross section. By calculating the average value of the obtained measurement values, respective Fe concentrations in the brazed surface 13a side and the opposite surface 13b side are determined.

In addition, the average purity of the overall metal layer 13 is measured by first immersing the metal layer 13 in a water bath (at about 100° C.), where an equal amount of water, hydrofluoric acid, and nitric acid are added, so as to degrade, and thereafter, measuring the degraded samples by employing inductively-coupled plasma atomic emission spectrometry (ICP-AES).

Next, a method for manufacturing a power module substrate 14 which is configured as mentioned above will be described.

First, a metal layer member having the same shape and the same size as those of the metal layer 13 is formed. The metal layer member is composed of an Al alloy having, in terms of an overall average, an Fe concentration of not less than 0.05 wt. % but not more than 1.0 wt. % and a purity of not less than 98.5 wt. % but not more than 99.95 wt. %. Thereafter, a brazing filler metal foil and the metal layer member are disposed on the rear surface of the ceramic substrate 11 in this order. In addition, a circuit layer member having the same shape and the same size as those of the circuit layer 12 is disposed on the front surface of the ceramic substrate 11 via a brazing filler metal foil.

Due to the procedure described above, a laminated body is formed in which a brazing filler metal foil and a circuit layer member are disposed on the front surface of the ceramic substrate 11 in this order, and the brazing filler metal foil and a metal layer member are disposed on the rear surface of the ceramic substrate 11 in this order.

Then, the laminated body is placed in an inert atmosphere, a reducing atmosphere, or a vacuum (at a degree of vacuum of $1 \times 10^{-5}$ Torr ($1.33 \times 10^{-3}$ Pa) or less) and heated at a temperature of not less than 577° C. but not more than 660° C. while being pressed in the lamination direction at a pressure within a range of 0.098 MPa to 0.294 MPa, thereby melting the brazing filler metal foil. As a result, the circuit layer member is brazed and joined to the front surface of the ceramic substrate 11 to form the circuit layer 12 while the metal layer member is brazed and joined to the rear surface of the ceramic substrate 11 to form the metal layer 13, thereby forming the power module substrate 14.

As described so far, according to the power module substrate of the present embodiment, since the Fe concentration in the brazed surface 13a side is set at less than 0.1 wt. % in the metal layer 13, even when stress is generated in the joint interface formed between the ceramic substrate 11 and the metal layer 13 during the heat cycle which is caused by the difference between the respective coefficients of thermal expansion of the ceramic substrate 11 and the metal layer 13, this stress can be absorbed by the plastic deformation of the brazed surface 13a side of the metal layer 13. As a result, the stress acting on the joint interface can be suppressed, and thus the joint reliability of the ceramic substrate 11 and the metal layer 13 can be improved.

On the other hand, since the Fe concentration in the opposite surface 13b side is set at not less than 0.1 wt. %, it is possible to gradually harden the opposite surface 13b side as the metal layer 13 thermally deforms repeatedly during the heat cycle, and thus the plastic deformation of this hardened part can be suppressed. As a result, even when cracks are developed in a second solder layer 18, which joins the opposite surface 13b side of the metal layer 13 and the heat sink 17, during the heat cycle, their further developments can be suppressed, and thus the joint reliability of the power module 10 can be improved.

Moreover, since the laminated body is pressed in the lamination direction when brazing the metal layer member and the ceramic substrate 11, it is possible to prevent the formation of an oxide film on the joint interface between the rear surface of the ceramic substrate 11 and the metal layer member, and the Fe contained in the side of a surface brazed with the ceramic substrate 11 in the metal layer member can be dissolved satisfactorily in the brazing filler metal melted in the joint interface. Therefore, the power module substrate 14 can reliably be formed, in which the concentration of Fe contained in the brazed surface 13a side of the metal layer 13 is set at less than 0.1 wt. %, and the concentration of Fe contained in the opposite surface 13b side is set at not less than 0.1 wt. %.

Furthermore, since the concentration of Si contained in the brazing filler metal foil that joins the metal layer member and the ceramic substrate 11 is higher than the concentration of Si contained in the metal layer member, the Si contained in the melted brazing filler metal can be diffused from the brazed surface side towards the inside of the metal layer member, as the amount of solid solubility limit of the Si in the metal layer member increases due to the heating during the brazing process, and thus the concentration of Si contained in the brazed surface side can be made higher than that in the opposite surface side. As a result, the amount of solid solubility limit of the Fe in the brazed surface side becomes smaller than that in the opposite surface side, and thus the concentration of Fe contained in the brazed surface side can be made lower than that in the opposite surface side. Therefore, as mentioned earlier, the power module substrate 14 with improved joint reliability can be formed even more reliably, as the satisfactory dissolution of the Fe, which is contained in the side of a surface brazed with the ceramic substrate 11 in the metal layer member, in the brazing filler metal melted in the joint interface becomes possible.

The technical scope of the present invention is not limited to the aforementioned embodiment and various modifications which do not depart from the spirit of the present invention can be added.

For example, a metal layer member or a circuit layer member may be formed by punching a base material or through a so-called etching process.

Next, a specific working Example regarding this manufacturing method will be described.

First, in terms of the material, the metal layer member and the circuit layer member were formed using an Al alloy containing about 0.3 wt. % of Fe and having a purity of 99.5%, the brazing filler metal that joined the metal layer 13, the circuit layer 12, and the ceramic substrate 11 was formed using Al—Si (the Al content was 92.5 wt. % whereas the Si content was 7.5 wt. %), and the ceramic substrate 11 was formed using AlN. In terms of the thickness, both of the metal layer 13 and the circuit layer 12 were about 0.6 mm, the brazing filler metal foil was about 30 μm, and the ceramic substrate 11 was about 0.635 mm. Note that the metal layer 13 had a quadrangular shape in plan view, and had vertical and horizontal dimensions of about 30 mm, respectively.

Then, the laminated body was placed in a vacuum (at a degree of vacuum of $1\times10^{-5}$ Torr ($1.33\times10^{-3}$ Pa) or less) and pressed in the lamination direction at a pressure within a range of 0.098 MPa to 0.294 MPa for about 1 hour, as a result of which the power module substrate 14 was formed.

Figure 2:
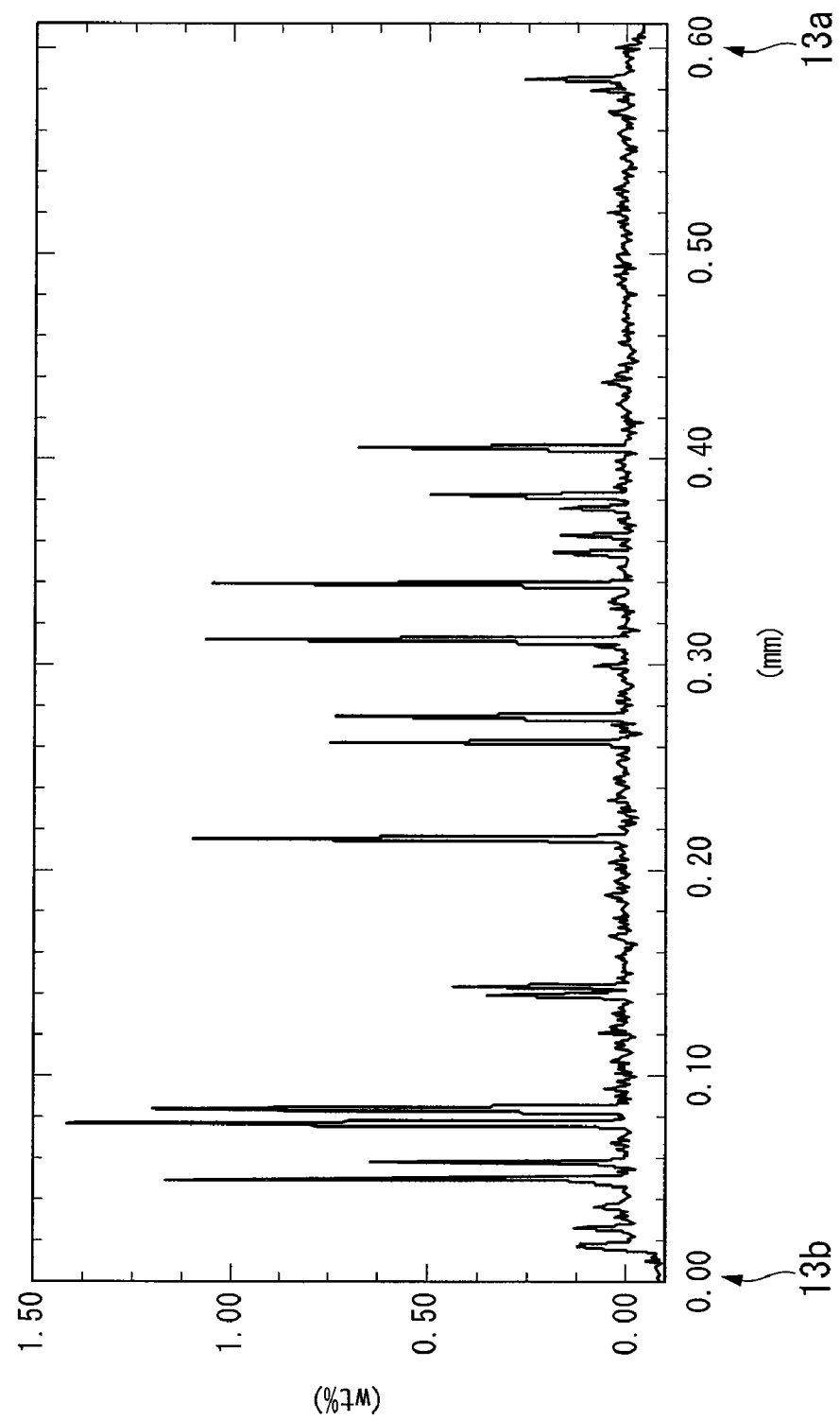
FIG. 2 is a diagram showing one example of Fe concentration distribution of the metal layer shown in FIG. 1 in the thickness direction.

The region in the brazed surface 13a side and the region in the opposite surface 13b side in the metal layer 13 of the power module substrate 14 were determined using an electron probe microanalyzer (EPMA). Specifically, in the cross section obtained by cutting the metal layer 13, the EPMA line analysis was conducted, from the opposite surface 13b towards the brazed surface 13a, with an acceleration voltage of 15 kV, an electric current value of $5\times10^{-8}$ A, a spot size of 1 μm, a measuring time per point of 5 seconds, and a movement interval of 1 μm. The results are shown in FIG. 2.

From this figure, it can be verified that in the metal layer, the Fe concentration was low, which was less than 0.1 wt. %, in a region ranging from the brazed surface 13a towards the opposite surface 13b to a point, which is positioned such that this region accounts for approximately 33% of the metal layer 13 in the thickness direction, the Fe concentration was high, which was not less than 0.1 wt. %, in a region which was close to the opposite surface 13b side.

Then, a test for verifying the effects described above was conducted.

8 different kinds of power module substrates were formed by changing at least one of the Al purity, thickness, and Fe concentration in a metal layer member used for forming a metal layer, so that in the metal layer of the respective power module substrates, at least one of the concentration of Fe contained in the brazed surface side, the concentration of Fe contained in the opposite surface side, the thickness of the brazed surface side, and the thickness of the opposite surface side was different. Then, heat sinks formed of pure Cu with identical performance were soldered to each of the metal layer surface of these power module substrates with a Sn—Ag—Cu—Ni—Ge based lead-free solder, and the resultants were subjected to a heat cycle composed of 2,000 cycles, where one cycle thereof was a temperature history composed of a temperature increase from −40° C. to 105° C. within about 3 minutes followed by a temperature decrease from 105° C. to −40° C. within 10 minutes.

Then, images of the joint interface between the ceramic substrate and the metal layer were taken using an ultrasonic imaging device (equipped with a 15 MHz probe), and the obtained imaging data were binarized to determine the area occupied by a peeled portion within the overall joint interface, from which a peeled area ratio was calculated.

Then, images of the joint interface between the metal layer and the heat sink joined by a solder were taken using an ultrasonic imaging device (equipped with a 15 MHz probe) in a similar manner, and the obtained imaging data were binarized to determine the area occupied by a solder crack development region within the overall joint interface, from which a solder crack development region area ratio was calculated. Evaluations regarding each of the peeled area ratio and solder crack development region area ratio were made so that those with the ratio exceeding 20% were assigned with a figure C, those with the ratio of more than 10% but not more than 20% were assigned with a figure B, and those with the ratio of not more than 10% were assigned with a figure A.

The Results are Shown in Table 1.

TABLE 1

| | Metal layer member | | | Metal layer | | | | |
| --- | --- | --- | --- | --- | --- | --- | --- | --- |
| | Al | | | Al purity | Brazed surface side | | | Opposite surface side |
| | purity (%) | Thickness (mm) | Fe conc. (wt. %) | after brazing (%) | Thickness (mm) | Ratio (%) | Fe conc. (wt. %) | Thickness (mm) |
| Ex. 1 | 99.5 | 0.6 | 0.3 | 99.3 | 0.2 | 33 | 0.04 | 0.4 |
| Ex. 2 | 99.5 | 0.8 | 0.38 | 99.4 | 0.25 | 31 | 0.04 | 0.55 |
| Ex. 3 | 99.4 | 0.6 | 0.45 | 99.4 | 0.18 | 30 | 0.06 | 0.42 |
| Ex. 4 | 99.0 | 0.6 | 0.74 | 98.8 | 0.1 | 17 | 0.07 | 0.5 |
| Ex. 5 | 98.5 | 0.6 | 1.0 | 98.4 | 0.04 | 7 | 0.07 | 0.56 |
| Comp. Ex. 1 | 99.99 | 0.4 | 0.001 | 99.7 | 0.4 | 100 | Not detected | Absent |
| Comp. Ex. 2 | 99.99 | 0.6 | 0.001 | 99.8 | 0.6 | 100 | Not detected | Absent |
| Comp. Ex. 3 | 99.8 | 0.6 | 0.05 | 99.7 | 0.6 | 100 | 0.03 | Absent |

| | Metal layer | | Heat cycle test | | | |
| --- | --- | --- | --- | --- | --- | --- |
| | Opposite surface side | | | | Metal layer/heat sink | |
| | Ratio (%) | Fe conc. (wt. %) | Ceramic substrate/metal layer | | Solder crack development | |
| | | | Peeled area ratio (%) | Evaluation | region area ratio (%) | Evaluation |
| Ex. 1 | 67 | 0.3 | 2 | A | 5 | A |
| Ex. 2 | 69 | 0.3 | 2 | A | 4 | A |
| Ex. 3 | 70 | 0.4 | 3 | A | 4 | A |
| Ex. 4 | 83 | 0.6 | 9 | A | 3 | A |
| Ex. 5 | 93 | 0.9 | 18 | B | 1 | A |
| Comp. Ex. 1 | 0 | — | 1 | A | 60 | C |
| Comp. Ex. 2 | 0 | — | 1 | A | 53 | C |
| Comp. Ex. 3 | 0 | — | 1 | A | 37 | C |

As a result, it was confirmed that the peeled area ratio was suppressed to a minimum and the joint reliability of the power module 10 could be improved even when the module was subjected to the aforementioned heat cycle of 2,000 cycles, as long as the metal layer 13 was formed of an Al alloy having an average purity of not less than 98.0 wt. % but not more than 99.9 wt. % as a whole, and the concentration of Fe contained in the side of a surface 13a brazed with the ceramic substrate 11 was set at less than 0.1 wt. %, and the concentration of Fe contained in the side of a surface 13b, which was opposite to the brazed surface 13a, was set at not less than 0.1 wt. %.

INDUSTRIAL APPLICABILITY

According to the power module substrate, method for producing a power module substrate, and power module of the present invention, the joint reliability of the power module can be improved.

The invention claimed is:

1. A power module substrate comprising:
    a ceramic substrate;
    a circuit layer brazed on a front surface of the ceramic substrate;
    a metal layer brazed on a rear surface of the ceramic substrate; and
    a semiconductor chip soldered to the circuit layer,
    wherein the metal layer is composed of an Al alloy having an average purity of not less than 98.0 wt. % but not more than 99.9 wt. % as a whole, and
    an Fe concentration in a side of a surface brazed with the ceramic substrate is set at less than 0.1 wt. %, whereas an Fe concentration in a side of a surface opposite to the surface brazed with the ceramic substrate is set at not less than 0.1 wt. %.

2. The power module substrate according to claim 1, wherein the side of a surface brazed with the ceramic substrate is a portion ranging from the surface brazed with the ceramic substrate, towards the surface opposite to the surface brazed with the ceramic substrate, down to a position so that the portion includes not less than 10% but not more than 50% of the metal layer in a thickness direction, while a remaining portion is the opposite surface side.

3. A power module comprising:
    a power module substrate, in which a circuit layer is brazed on a front surface of a ceramic substrate while a metal layer is brazed on a rear surface of the ceramic substrate;
    a semiconductor chip soldered to a surface of the circuit layer; and
    a heat sink joined to a surface of the metal layer,
    wherein the power module substrate is a power module substrate of claim 1.

4. The power module according to claim 3, wherein the heat sink is composed of pure Cu and is soldered to the surface of the metal layer with a Sn—Ag—Cu—Ni—Ge based lead-free solder.

* * * * *